United States Patent
Bhojani et al.

(10) Patent No.: US 10,483,384 B2
(45) Date of Patent: Nov. 19, 2019

(54) TRANSISTOR DEVICE WITH HIGH CURRENT ROBUSTNESS

(71) Applicant: Infineon Technologies AG, Neubiberg (DE)

(72) Inventors: Riteshkumar Bhojani, Chemnitz (DE); Franz-Josef Niedernostheide, Hagen a. T.W. (DE); Hans-Joachim Schulze, Taufkirchen (DE); Josef Lutz, Chemnitz (DE); Roman Baburske, Otterfing (DE)

(73) Assignee: Infineon Technologies AG, Neubiberg (DE)

( * ) Notice: Subject to any disclaimer, the term of this patent is extended or adjusted under 35 U.S.C. 154(b) by 74 days.

(21) Appl. No.: 15/682,807

(22) Filed: Aug. 22, 2017

(65) Prior Publication Data

US 2018/0061971 A1 Mar. 1, 2018

(30) Foreign Application Priority Data

Aug. 25, 2016 (DE) .................. 10 2016 115 801

(51) Int. Cl.
*H01L 29/739* (2006.01)
*H01L 27/02* (2006.01)
(Continued)

(52) U.S. Cl.
CPC ...... *H01L 29/7393* (2013.01); *H01L 27/0222* (2013.01); *H01L 29/0619* (2013.01);
(Continued)

(58) Field of Classification Search
None
See application file for complete search history.

(56) References Cited

U.S. PATENT DOCUMENTS

| 2007/0278472 A1* | 12/2007 | Mauder | ................. H01L 21/263 257/11 |
| 2010/0078765 A1* | 4/2010 | Schulze | .............. H01L 29/0615 257/587 |

(Continued)

FOREIGN PATENT DOCUMENTS

| DE | 10361136 A1 | 7/2005 |
| DE | 102005029263 A1 | 1/2007 |

(Continued)

*Primary Examiner* — Charles D Garber
*Assistant Examiner* — Xiaoming Liu
(74) *Attorney, Agent, or Firm* — Murphy, Bilak & Homiller, PLLC

(57) ABSTRACT

A transistor device includes a first emitter region of a first doping type, a second emitter region of a second doping type, a body of the second doping type, a drift region of the first doping type, a field-stop region of the first doping type, at least one boost structure, and a gate electrode. The boost structure is arranged between the field-stop region and the second emitter region. The at least one boost structure includes a base region of the first doping type and at least one auxiliary emitter region of the second doping type separated from the second emitter region by the base region. An overall dopant dose in the drift region and the field-stop region in a current flow direction of the transistor device is higher than a breakthrough charge of a semiconductor material of the drift region and the field-stop region.

19 Claims, 4 Drawing Sheets

(51) Int. Cl.
*H01L 29/36* (2006.01)
*H03K 17/16* (2006.01)
*H01L 29/06* (2006.01)
*H01L 29/08* (2006.01)

(52) U.S. Cl.
CPC ...... *H01L 29/0696* (2013.01); *H01L 29/0834* (2013.01); *H01L 29/36* (2013.01); *H01L 29/7397* (2013.01); *H03K 17/16* (2013.01)

(56) References Cited

U.S. PATENT DOCUMENTS

| | | | | |
|---|---|---|---|---|
| 2013/0264607 A1* | 10/2013 | Werber | ............... | H01L 29/7396 257/124 |
| 2013/0328105 A1* | 12/2013 | Matsuura | ............ | H01L 29/0696 257/139 |
| 2014/0015007 A1* | 1/2014 | Werber | ............... | H01L 29/0615 257/142 |
| 2014/0209970 A1* | 7/2014 | Schulze | .................. | H01L 21/04 257/139 |
| 2015/0091053 A1* | 4/2015 | Sandow | ............. | H01L 29/7393 257/139 |

FOREIGN PATENT DOCUMENTS

| | | |
|---|---|---|
| DE | 102007020657 A1 | 11/2008 |
| DE | 102013105057 A1 | 11/2013 |
| DE | 102014101951 A1 | 8/2014 |
| DE | 102015115723 A1 | 3/2016 |

* cited by examiner

TRANSISTOR DEVICE WITH HIGH CURRENT ROBUSTNESS

TECHNICAL FIELD

This disclosure in general relates to a transistor device, in particular an IGBT (Insulated Gate Bipolar Transistor).

BACKGROUND

An IGBT includes a source region of a first conductivity type (doping type) and a drain region of a second conductivity type complementary to the first conductivity type. The source region is often referred to as first emitter region and the drain region is often referred to as second emitter region. A body region of the second conductivity type adjoins the first emitter region, and a drift region of the first conductivity type adjoins the body region and is arranged between the body region and the second emitter region. A gate electrode is located adjacent the body region, dielectrically insulated from the body region by a gate dielectric, and serves to control a conducting channel in the body region.

In an on-state of the IGBT, the first emitter region injects first type charge carriers via the conducting channel into the drift region and the second emitter region injects second type charge carriers into the drift region where the first type charge carriers and the second type charge carriers form a charge carrier plasma.

Important operation parameters of an IGBT are the saturation voltage (often referred to as $Vc_{CEsat}$) and the saturation current (often referred to as $I_{CEsat}$). The saturation voltage is the voltage between the first emitter region and the second emitter region of the IGBT at a typical current (rated current) in a normal operation mode of the IGBT. The saturation voltage characterizes the power losses that occur in a normal operation mode of the IGBT. The saturation current is the current that occurs at voltages much higher than the saturation voltage, that is, the saturation current characterizes the behaviour of the IGBT in an overload scenario such as, for example, a short-circuit in a load connected to the IGBT. The critical saturation current, inter alia, defines the robustness of the IGBT against high currents. The higher the critical saturation current the more robust the IGBT is against a current crowding during a short-circuit event.

The critical current can be increased by increasing a doping concentration of the second emitter. Increasing this doping concentration, however, may result in increased losses (that are often referred to as reverse recovery losses) when switching off the IGBT, and higher leakage currents when the IGBT is in the off-state.

There is therefore a need to provide an IGBT with a high critical saturation current and low switching and leakage losses.

SUMMARY

One example relates to a transistor device. The transistor device includes a first emitter region of a first doping type, a second emitter region of a second doping type, a body region of the second doping type, a drift region of the first doping type, a field-stop region of the first doping type, and at least one boost structure. A gate electrode is dielectrically insulated from the body region by a gate dielectric. The body region is arranged between the first emitter region and the drift region, the field-stop region is arranged between the drift region and the boost structure, and the boost structure is arranged between the field-stop region and the second emitter region. The at least one boost structure includes a base region of the first doping type and at least one auxiliary emitter region of the second doping type separated from the second emitter region by the base region. An overall dopant dose in the drift region and the field-stop region in a current flow direction of the transistor device is higher than a breakthrough charge of a semiconductor material of the drift region and the field-stop region.

Another example relates to a transistor device that can be operated in an on-state and an off-state. The transistor device includes a first emitter region of a first doping type, a second emitter region of a second doping type, a body region of the second doping type, a drift region of the first doping type, a field-stop region of the first doping type, and at least one boost structure. A gate electrode is dielectrically insulated from the body region by a gate dielectric. The body region is arranged between the first emitter region and the drift region, the field-stop region is arranged between the drift region and the boost structure, and the boost structure is arranged between the field-stop region and the second emitter region. The at least one boost structure includes a base region of the first doping type and at least one auxiliary emitter region of the second doping type separated from the second emitter region by the base region. A doping profile of the drift region and the field-stop region is such that in the off-state of the transistor device an electric field associated with applying a load path voltage between the first emitter region and the second emitter region stops in the field-stop region spaced apart from the at least one auxiliary emitter region when a critical field strength is reached at a pn junction between the body region and the drift region.

Those skilled in the art will recognize additional features and advantages upon reading the following detailed description, and upon viewing the accompanying drawings.

BRIEF DESCRIPTION OF THE FIGURES

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

Figure 1:
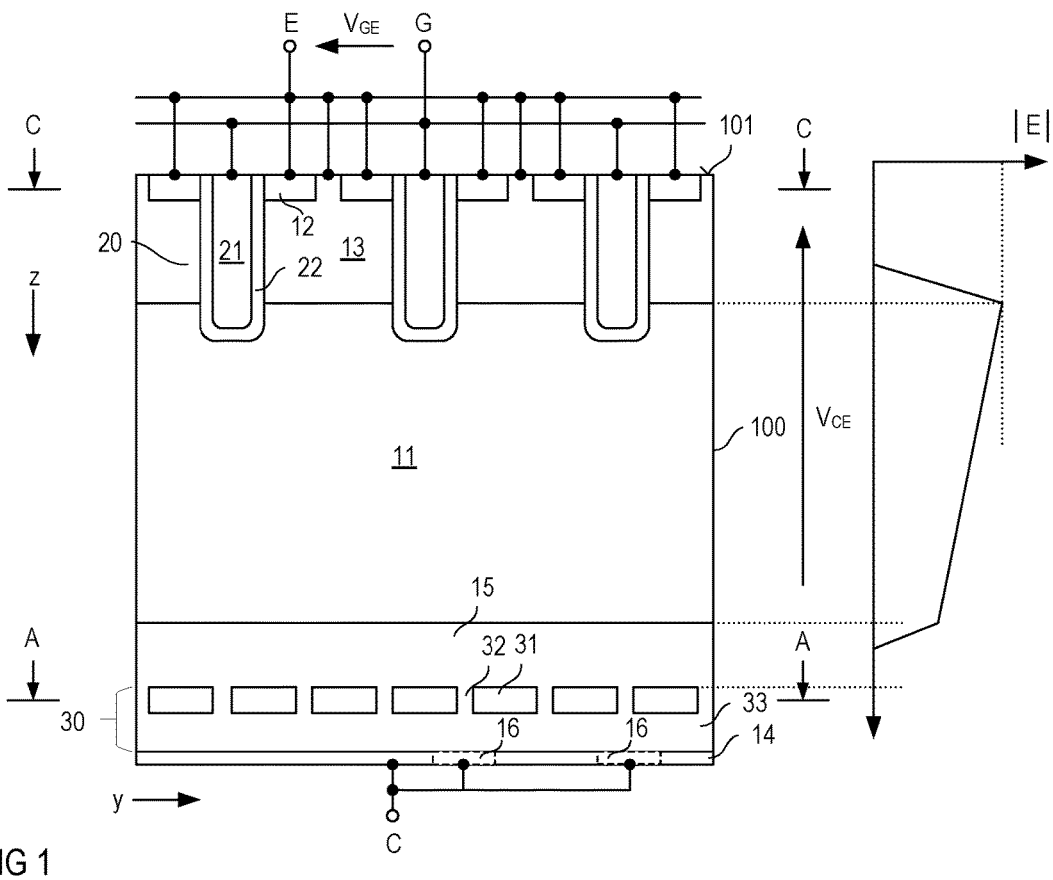
FIG. 1 illustrates a vertical cross sectional view of one section of a transistor device that includes a boost structure between a field-stop region and an emitter region.

FIG. 1 shows a vertical cross sectional view of one section of a transistor device, in particular an IGBT. Referring to FIG. 1, the transistor device includes a semiconductor body 100 and active device regions 11-15 included in the semiconductor body 100. The semiconductor body 100 includes a first surface 101. FIG. 1 shows a vertical cross sectional view in a vertical section plane of the semiconductor body 100. The "vertical section plane" is perpendicular to the first surface 101 in a vertical direction z of the semiconductor body 100. The semiconductor body 100 may include a conventional (monocrystalline) semiconductor material such as silicon (Si) or silicon carbide (SiC), the latter being a compound semiconductor material. Example parameters such as doping concentrations given below refer to silicon, unless otherwise stated.

Referring to FIG. 1, the transistor device includes a first emitter region 12 of a first doping type, a second emitter region 14 of a second doping type complementary to the first doping type, a body region 13 of the second doping type, a drift region 11 of the first doping type, a field-stop region 15 of the first doping type, and at least one boost structure 30. The body region 13 is arranged between the first emitter region 12 and the drift region 11, the field-stop region 15 is arranged between the drift region 11 and the boost structure, and the boost structure is arranged between the field-stop region and the second emitter region 14. A gate electrode 21 is dielectrically insulated from the body region 13 by a gate dielectric 22 and is configured to control a conducting channel in the body region 13 between the source region 12 and the drift region 11 along the gate dielectric 22.

The transistor device may include a plurality of device cells (which may also be referred to as transistor cells). Several of these device cells are illustrated in FIG. 1. Each of these device cells includes a source region 12, a body region 13, a gate electrode 21, and a gate dielectric 22, whereas two or more device cells may share one body region 13 and two or more device cells may share one gate electrode 21. A region of the semiconductor body 100 in which the device cells are located is referred to as cell region in the following. In the example shown in FIG. 1, the individual device cells share one drift region 11. That is, the body regions 13 of the individual device cells adjoin one drift region 11.

Referring to FIG. 1, the individual device cells are connected in parallel by having the gate electrodes 21 connected to a common gate node G and by having the source regions 12 connected to a common emitter node E. Electrical connections between the gate electrodes 21 and the gate node G and electrical connections between the source regions 12 and the emitter node E are only schematically illustrated in FIG. 1. Furthermore, the body regions 13 are electrically connected to the emitter node E, whereas these electrical connections are only schematically illustrated in FIG. 1.

The transistor device can be implemented as a reverse-blocking (RB) transistor device (RB-IGBT) or a reverse-conducting (RC) transistor device (RC-IGBT). An RC-IGBT, additionally to the device features explained before, includes one or more emitter short regions 16 of the first doping type in the second emitter region 14. These emitter short regions (which are illustrated in dashed lines in FIG. 1) are connected to the drain node D and extend through the second emitter region 14.

Referring to FIG. 1, the at least one boost structure 30 includes a base region 33 of the first doping type and at least one auxiliary emitter region 31 of the second doping type. The base region 33 is arranged between the at least one auxiliary emitter region 31 and the second emitter region 14. According to one example, the base region 33 adjoins both, the at least one auxiliary emitter region 31 and the second emitter region 14. The at least one boost structure 30 furthermore includes at least one pass region 32 of the first doping type. The at least one pass region 32 connects the field-stop region 15 with the base region 32 and allows charge carriers to pass the at least one auxiliary emitter region 31 between the field-stop region 15 and the base region 32. One way of operation of the at least one boost structure 30 is explained in further detail herein further below.

The at least one boost structure 30, in particular the at least one auxiliary emitter region 31 and the at least one pass region 32, can be implemented in accordance with one of a plurality of different topologies. Three of these possible topologies are explained with reference to FIGS. 2 to 4 below. Each of FIGS. 2 to 4 shows one section of the boost structure 30 in a horizontal section plane A-A (shown in FIG. 1) that cuts through the at least one auxiliary emitter region 31 and the at least one pass region 32.

Figure 2:
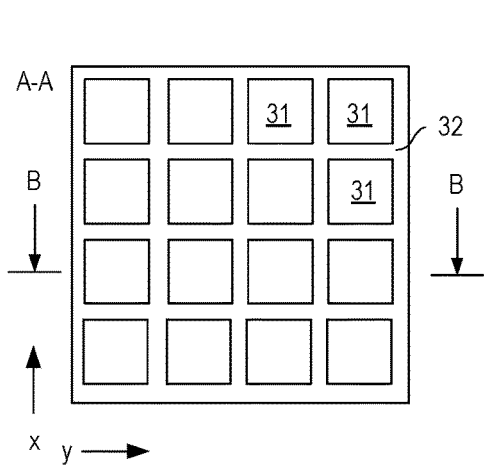
FIG. 2 illustrates a horizontal cross sectional view of the boost structure according to one example.

In the example shown in FIG. 2, the boost structure 30 includes a plurality of auxiliary emitter regions 31 that are spaced apart from each other in a first horizontal direction x and a second horizontal direction y of the semiconductor body 100. In this example, each of the auxiliary emitter regions 31 is rectangular and the pass region 32 has the shape of a rectangular grid. This, however, is only an example.

According to another example (not shown) the auxiliary emitter regions 31 have an elliptical shape, a circular shape, any type of polygonal shape, or the like.

Figure 3:
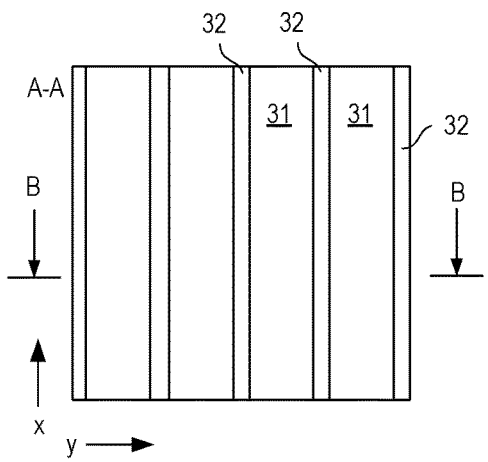
FIG. 3 illustrates a horizontal cross sectional view of the boost structure according to another example.
Figure 4:
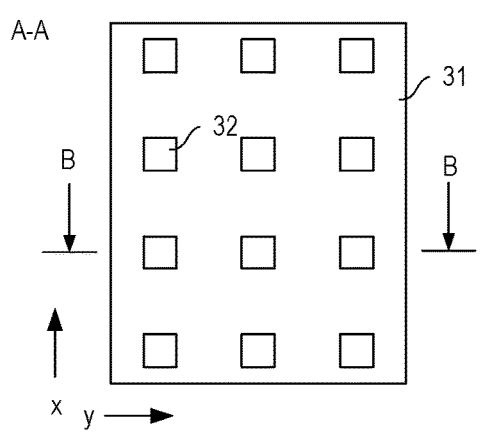
FIG. 4 illustrates a horizontal cross sectional view of the boost structure according to yet another example.

In the example shown in FIG. 3, the boost structure 30 includes a plurality of auxiliary emitter regions 31 and a plurality of pass regions 32. Each of the auxiliary emitter regions 31 and the pass regions 32 is elongated in the first horizontal direction x. In the second horizontal direction y pass regions 32 and auxiliary emitter regions 31 are arranged alternately so that one pass region 32 is arranged between two auxiliary emitter regions 31 and one auxiliary emitter region 31 is arranged between two pass regions 32.

In the example shown in FIG. 4, the boost structure includes one auxiliary emitter region 31 with a grid shape and a plurality of pass regions 32 that are spaced apart from each other in the first horizontal direction x and the second horizontal direction y. The pass regions 32 are rectangular in the example shown in FIG. 4. This, however, is only an example. According to another example (not shown) the pass regions 32 have an elliptical shape, a circular shape, any type of polygonal shape, or the like.

According to one example, the boost structure 30 has a uniform topology. That is, the topology only includes auxiliary emitter regions 31 of the same type, the same size, the same doping concentration and the same mutual distance. According to another example, at least one of these parameters, type of auxiliary emitter region, size of the auxiliary emitter region, doping concentration of the auxiliary emitter region, and mutual distance of auxiliary emitter regions 31 varies. That is, the boost structure may include at least one of the following: different types of auxiliary emitter regions 31, such as auxiliary emitter regions selected from two or more of the examples shown in FIGS. 2 to 4; different sizes of the auxiliary emitter regions at different locations of the boost structure; different doping concentrations of the auxiliary emitter regions 31 at different locations of the boost structure 30; and different distances between the auxiliary emitter regions 31 at different locations of the boost structure 30. Those variations may help to improve the robustness and/or the softness. Variations as explained above may be restricted to selected areas, such as for example to the active region or the edge terminations. The "active region" is a of the transistor device that includes device cells, the "edge region" is a region adjacent the active region.

According to one example, a doping concentration of the base region 33 is substantially homogenous. According to another example, the doping concentration of the base region 33 varies in at least one of the first and second lateral directions x, y.

Figure 5:
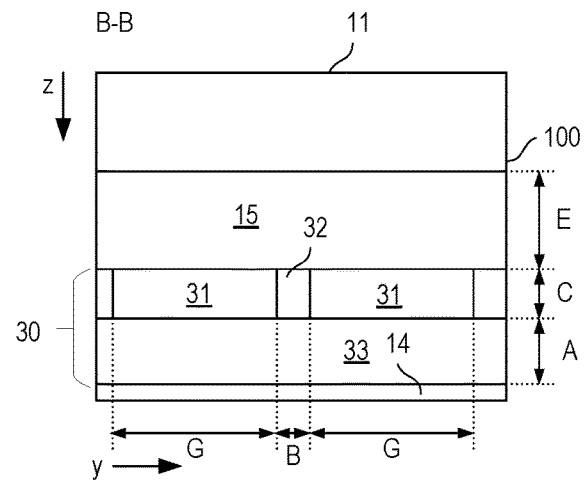
FIG. 5 illustrates an enlarged view of the boost structure according to one example.

FIG. 5 shows an enlarged view of one section of the boost structure 30 and the field-stop region 15 in order to explain example dimensions of individual sections of the boost structure 30 and the field-stop region 15. FIG. 5 shows two auxiliary emitter regions 31 separated by a pass region 32. These two auxiliary emitter regions 31 are either separate auxiliary emitter regions as shown in FIGS. 2 and 3, for example, or different sections of one grid-shaped auxiliary emitter region 31 as shown in FIG. 4, for example. Equivalently, the pass region 32 shown in FIG. 5 is either one of a plurality of separate pass regions 32 as shown in FIGS. 3 and 4, for example, or one section of a grid-shaped pass region 32 as shown in FIG. 2, for example. In the following, "auxiliary emitter region 31" is used to denote either one individual auxiliary emitter region, or one section of an auxiliary emitter region. Equivalently, "pass region" denotes one individual pass region 32 or one section of a pass region.

Referring to FIG. 5, each of the auxiliary emitter regions 31 has a first dimension C in the vertical direction z of the semiconductor body 100 and a second dimension G in the second horizontal direction y. Referring to FIG. 1, the vertical direction z is a direction perpendicular to the first surface 101. The first horizontal direction x and the second horizontal direction y are parallel to the first surface 101 and perpendicular to the vertical direction z. According to one example, the first horizontal direction x is perpendicular to the second horizontal direction y. Just for the purpose of illustration, the first dimension C is referred to as height and the second dimension G is referred to as width of the auxiliary emitter region 31 in the following. According to one example, the width G is selected from a range of between 2 micrometers (μm) and 15 micrometers, in particular between 4 micrometers and 9 micrometers. According to one example, the height C is selected from a range of between 500 nanometers and 10 micrometers, in particular between 2 micrometers and 8 micrometers. A distance B between the auxiliary emitter regions 31 in the second lateral direction y, that is, a width of the pass region 32 is selected from a range of between 500 nanometers and 10 micrometers, in particular between 2 micrometers and 8 micrometers, for example. According to one example a distance A between the at least one auxiliary emitter region 31 and the second emitter 14 is selected from a range of between 0.5 micrometers and 10 micrometers, in particular between 0.5 micrometers and 5 micrometers. A distance between the at least one auxiliary emitter region 31 and the drift region 11, that is, a dimension of the field-stop region 15 in the vertical direction z of the semiconductor body 100 is selected from a range of between 2 micrometers and 20 micrometers, in particular between 5 micrometers and 15 micrometers, according to one example.

Figure 6:
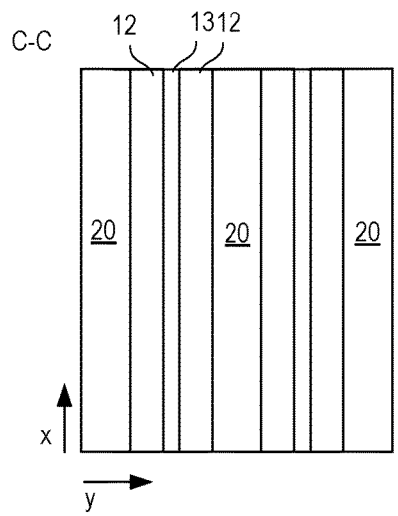
FIG. 6 shows a horizontal cross sectional view of a cell region of the transistor device shown in FIG. 1 according to one example.
Figure 7:
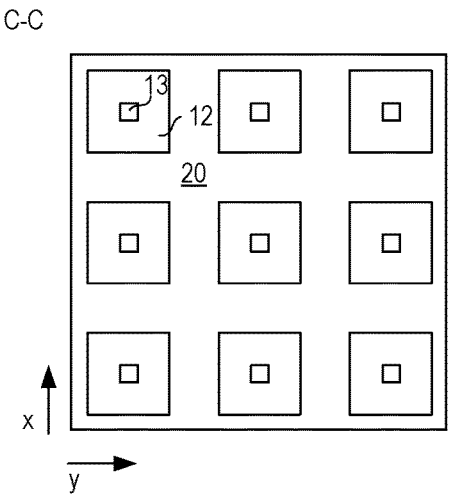
FIG. 7 shows a horizontal cross sectional view of a cell region of the transistor device shown in FIG. 1 according to another example.

The cell region of the transistor device, that is, the individual transistor cells can be implemented in various ways. Two examples of how the transistor cells may be implemented are illustrated in FIGS. 6 and 7. Each of these figures shows a horizontal cross sectional view of the cell region in a horizontal section plane C-C (see FIG. 1) that cuts through the source regions 12. In the example shown in FIG. 6, the individual transistor cells are elongated cells (stripe cells). In this case, the source regions 12, body regions 13 and gate structures 20 are elongated in the first lateral direction x. The gate structures 20, as shown in FIG. 1, include the gate electrodes 21 and gate dielectrics 22. In the example shown in FIG. 7, there is one gate structure 20 that has the form of a grid, wherein the body and source regions 13, 12 are arranged in spaces formed by the grid. In this example, the gate structure 20 has the form of a rectangular grid so that the transistor cells are rectangular cells. This, however, is only an example. According to another example (not shown) the transistor cells may have an elliptical, circular, or any type of polygonal shape.

Figure 8:
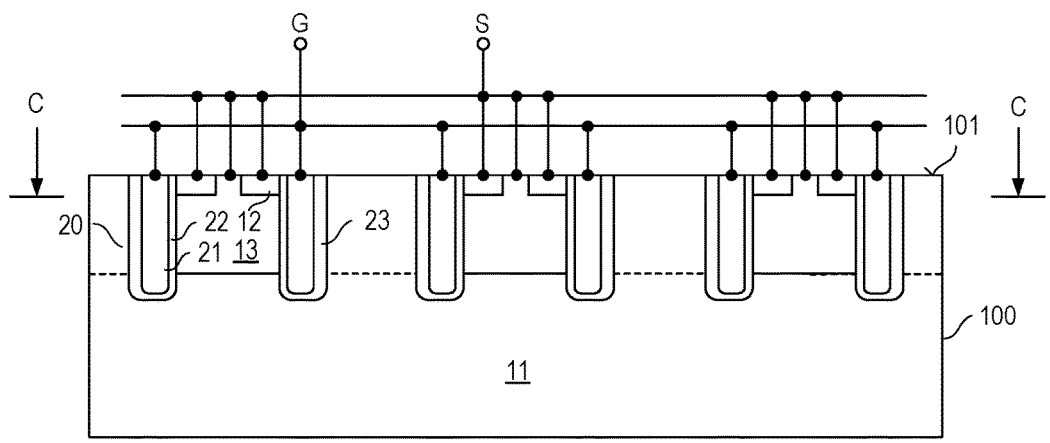
FIG. 8 shows a vertical cross sectional view of a cell region of a transistor device according to another example.

FIG. 8 shows a vertical cross sectional view of a cell region according to another example. In this example, there are sections of the drift region 11 that extend to the first surface 101 between neighboring gate structures. Alternatively, (illustrated in dashed lines in FIG. 8) there is a floating semiconductor region of the second doping type between two neighboring gate structures. Those sections of the drift region 11 extending to the first surface 101 and arranged between neighboring gate structures 20, or floating semiconductor regions of the second doping type, are referred to as inactive regions in the following. The inactive regions are dielectrically insulated from the gate electrodes 21 by dielectric layers 23. According to one example, these dielectric layers are thicker than the gate dielectrics. A thickness of these thicker dielectric layers 23 is between 200 nanometers and 800 nanometers, for example. In the example shown in FIG. 8, the thicker dielectric layers 23 are arranged only along sidewalls of the trenches that are opposite those sidewalls that adjoin the body regions 13. This, however, is only an example. According to another example (not shown), the thicker dielectric layers 23 extend below the trench bottom and may extend even further along the opposite trench sidewall to just below to the p-n junction formed between the body region and 13 and the drift region 11. By suitably selecting the number and size of these inactive regions an overall channel width of the transistor device can be adjusted. The "overall channel width" is the overall length of the gate dielectrics 21 in the body regions 13 in a direction perpendicular to the current flow direction. In the example shown in FIG. 8, the current flow direction is the vertical direction z of the semiconductor body 100.

Figure 9:
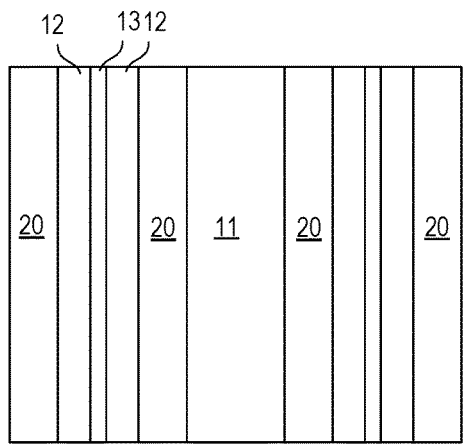
FIG. 9 shows a horizontal cross sectional view of the cell region shown in FIG. 8 according to one example.
Figure 10:
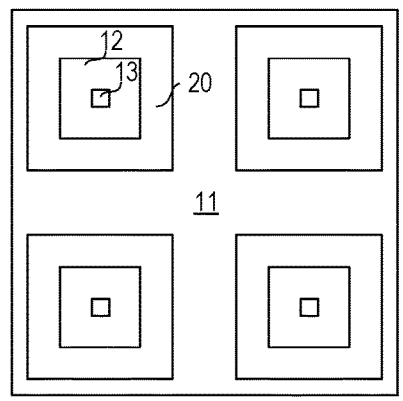
FIG. 10 shows a horizontal cross sectional view of the cell region shown in FIG. 8 according to another example.

In the horizontal plane, the device cells shown in FIG. 8 may be implemented in various ways. Two possible examples for implementing these device cells are shown in FIGS. 9 and 10. Each of these figures shows a horizontal cross sectional view of the cell region shown in FIG. 8 in a horizontal section plane C-C. In the example shown in FIG. 9, the device cells are elongated cells (stripe cells). In this case, the source regions 12, body regions 13 and gate structures 20 are elongated in the first lateral direction x. According to another example, shown in FIG. 10, there is a plurality of gate structures 20 forming a ring wherein a source region 12 and a body region 13 is located inside each of these rings. An inactive region between these gate structures 20 has the form of a grid in this example. In the example shown in FIG. 10, the gate structures form rectangular rings. This, however, is only an example. Any other type of ring such as, for example, an elliptical, circular, or any type of polygonal ring may be implemented as well.

Figure 11:
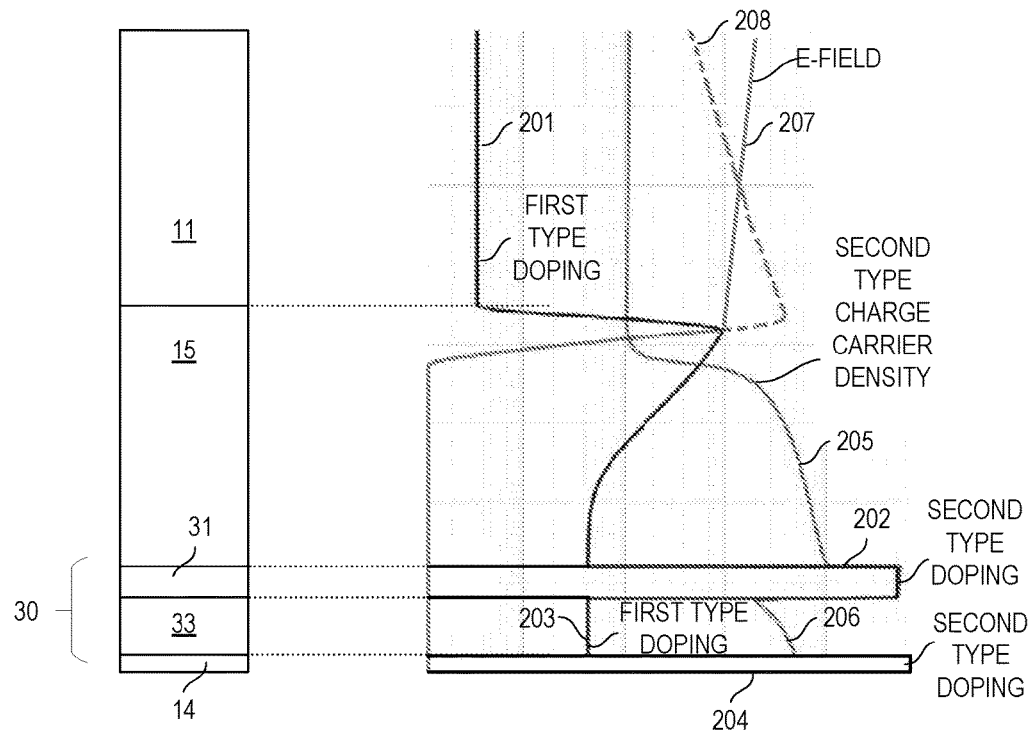
FIG. 11 shows one section of a transistor device, example doping concentrations of device regions in this section of the transistor device, the electric field in this section of the transistor device in a certain operation state, and a charge carrier concentration of a certain type in this operation state.

Modes of operation of the transistor device and, in particular, the function of the boost structure 30 are explained below with reference to FIGS. 1 and 11. FIG. 11 on the left shows an enlarged view of one section of the transistor device and on the right shows curves that illustrate operation parameters of the transistor device.

The transistor device can be switched on and off by applying a suitable drive voltage $V_{GE}$ between the gate node G and the emitter node E. The transistor device is in the on-state if the drive voltage $V_{GE}$ is such that there is a conducting channel (inversion channel) in the body region 13 between the source region 12 and the drift region 11 along the gate dielectric 22. In a transistor device where the first doping type is an n-type and the second doping type is a p-type, so that the source region 12 and the drift region 11 are n-doped and the body region 13 is p-doped, the drive voltage $V_{GE}$ that switches on the transistor device is a positive voltage higher than a threshold voltage of the transistor device. The transistor device is in the off-state if the drive voltage $V_{GE}$ is such that the conducting channel in the body region 13 between the source region 12 and the drift region 11 is interrupted. In the on-state (when switched on), the transistor device conducts a current between the collector node C and the emitter node E if a load path voltage (collector-emitter voltage) $V_{CE}$ is applied between the collector node C and the emitter node E. For the purpose of explanation it is assumed that a polarity of the load path voltage $V_{CE}$ is such that it forward biases a pn-junction between the second emitter region 14 and the base region 33. In a transistor device in which the first doping type is an n-type and the second doping type is a p-type this pn-junction is forward biased if the load path voltage $V_{CE}$ between the collector node C and the emitter node E is a positive voltage. In the following, "load path voltage" denotes a voltage that forward biases this pn-junction.

When the transistor device is in the on-state and there is a load path voltage between the collector node C and the emitter node E, the first emitter regions 12 inject first type charge carriers into the drift region 11 via the conducting channel in the body region 12, and the second emitter region 14 injects second type charge carriers via the base region 33, the at least one pass region 32 and the field-stop region 15 into the drift region 11. In the drift region 11, these first type charge carriers and second type charge carriers form a charge carrier plasma that causes a low on-resistance of the transistor device. The "on-resistance" of the transistor device is the electrical resistance between the collector node C and the emitter node E in the on-state.

In the on-state, there are two different operation modes of the transistor device, a first mode in which the boost structure 30 is inactive, and a second mode in which the boost structure 30 is active. The first mode is also referred to as normal mode and the second mode is also referred to as boost mode or high-current mode in the following. The transistor device is in the normal mode if a current between the collector node C and the emitter node E is below a predefined threshold, and the transistor device is in the boost mode if the current is higher than the predefined threshold. In the normal mode, that is, in the on-state if the current is below the threshold, the at least one auxiliary emitter region 31 is inactive, that is, the at least one auxiliary emitter region 31 does not emit or emits only a negligible amount of second type charge carriers into the field-stop region 15 and the drift region 11, respectively. In the boost mode, the at least one auxiliary emitter region 31 is active and, therefore, emits second type charge carriers via the field-stop region 15 into the drift region 11. The curves labeled with 205 and 206 in FIG. 11 illustrate the second type charge carrier density in the base region 33 and the field-stop region 15 in the boost mode of the transistor device. Based on these curves 205 and 206 it can be seen that in the boost mode the second emitter 14 and the at least one auxiliary emitter 31 emits second type charge carriers. These second type charge carriers are holes if the second doping type is a p-type.

Curve 207 shown in FIG. 11 illustrates the electric field in the drift region 11, the field-stop region 15 and the boost structure 30 in the boost mode. As can be seen from curve 207 the electric field stops in the field-stop region 15 spaced apart from the boost structure, that is, a field strength of the electric field turns zero or substantially zero in the field stop region. Furthermore, the boost structure by injecting second type charge carriers helps to prevent a peak of the electric field in a section of the drift region 11 close to the field-stop region. This can be seen from curve 207 in that the field strength decreases towards the field-stop region 15.

The dashed curve 208 shown in FIG. 11 illustrates an electric field that has field peak in the drift region 11 close to the field-stop region 15. Such a field peak close to the field-stop region may occur in a conventional device without boost structure. A field peak close to field stop region 15 may also occur in the device with the boost structure 30 before the boost structure 30 is activated. After the boost structure is activated and injects second type charge carriers into the drift region 11 the peak of the electric field is "shifted back" towards the pn-junction between the body region 13 and the drift region 11 so that at higher currents a field profile as illustrated by curve 207 results.

Figure 12:
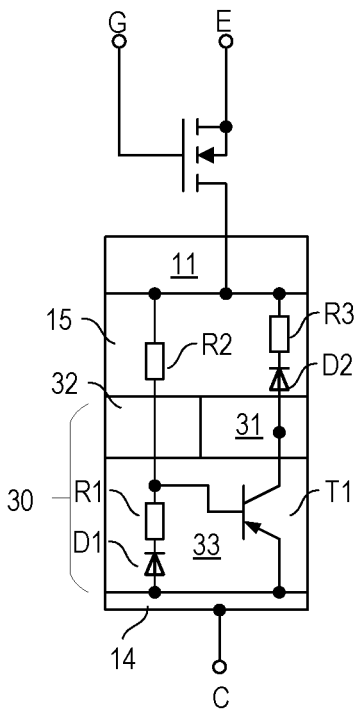
FIG. 12 shows one section of the transistor device and an equivalent circuit diagram of this section of the transistor device.

One way of operation of the boost structure is shown in FIG. 12, which shows one section of the boost structure 30, the field-stop region 15, the drift region 11 and the second emitter region 14 and an equivalent circuit diagram of an electronic circuit formed by these regions. Just for the purpose of illustration, it is assumed that the first doping type is an n-type and the second doping type is a p-type, so that the second emitter region 14 and the auxiliary emitter regions 31 are p-type region and the drift region 11, the field-stop region 15, the pass region 32 and the base region 33 are n-type regions. Referring to FIG. 12, the second emitter region 14, the base region 33, the pass region 32 and the field-stop region 15 form a series circuit with a diode D1 and electrical resistors R1, R2 between the second emitter region 14 and the drift region 11. The diode D1 is formed by the pn junction between the second emitter region 14 and the base region 33. The resistors R1, R2 are formed by electrical resistances of the base region 33, the pass region 32 and the field-stop region 15. The second emitter region 14, the base region 33 and the auxiliary emitter region 31 form a bipolar transistor T1, which is a pnp transistor in this example. The second emitter region 14 forms an emitter, the base region 33 forms a base and the auxiliary emitter region 31 forms a collector of this bipolar transistor T1. A diode D2 connected in series with this bipolar transistor T1 is formed by a pn junction between the auxiliary emitter region 31 and the field-stop region 15, and a resistor R3 connected in series with this diode D2 is formed by an electrical resistance of the field-stop region 15.

The transistor device is in the normal mode if the bipolar transistor T1 of the boost structure 30 is inactive (in an off-state), and the transistor device is in the boost mode if the bipolar transistor T1 is active (in an on-state). Whether or not the bipolar transistor T1 is active, is dependent on a voltage drop across the base region 33 in the on-state of the transistor device, that is, a voltage drop across resistor R1 in the equivalent circuit diagram shown in FIG. 12. The bipolar transistor T1 switches on when a current through the base region 33 is such that a voltage drop across the base region 33 reaches the threshold voltage of the bipolar transistor. This threshold voltage of the bipolar transistor T1 and, therefore, a current level of a load current of the transistor device at which the bipolar transistor T1 is activated (so that the transistor device enters the boost mode) is, inter alia, dependent on the length A of the base region 33 explained with reference to FIG. 5, and the doping concentration of the base region 33. The doping concentration of the base region 33 is, for example, selected from a range of between 1E14 cm$^{-3}$ and 5E15 cm$^{-3}$. According to one example, a doping concentration of the pass region 32 is substantially equal the doping concentration of the base region 33.

In the boost mode of the transistor device, the boost structure 30, additionally to the second emitter region 14, injects second type charge carriers into the drift region 11. This may help to avoid a shift of a peak of an electric-field in the drift region 11 from a region close to the body region 13 and the first emitter region 12, respectively, to a region close to the field-stop region 15 and the second emitter region 14, respectively, and, therefore, may help to suppress a formation of current filaments. The electric field is associated with the current flowing through the drift region and is different from the electric field in the off-state illustrated in FIG. 1. With other words, the boost structure increases the high-current robustness of the transistor device. This increase of the high-robustness, however, does not result in increased switching losses. This is explained below.

In the normal mode, only the second emitter region 14 injects second type charge carriers into the drift region 11. In the transistor device explained before, the second emitter region 14 may be designed to obtain a desired operation characteristic in the normal mode, that is, when the boost structure 30 is not active. The design of the second emitter region 14, inter alia, affects switching losses of the transistor device. Those switching losses include turn-off losses, which are losses that occur when the transistor device switches from the on-state to the off-state. In particular, turn-off losses are associated with losses that occur in context with removing the charge carrier plasma from the drift region 11. These turn-off losses increase as a doping concentration of the second emitter region 14 increases. In a conventional transistor device, that is, a transistor device without boost structure, there is a trade-off between turn-off losses and the capability of the transistor device to withstand high currents. The turn-off losses decrease as the doping concentration of the second emitter decreases. A decrease of the doping concentration, however, reduces the efficiency of the second emitter which in turn decreases the capability to withstand high currents. On the other hand, the capability to withstand high currents increases as the doping concentration of the second emitter increases. This, however, also increases the turn-off losses.

In the transistor device explained before, turn-off losses and high-current robustness can be adjusted independently. The turn-off losses can be adjusted by suitably selecting a doping concentration of the second emitter region 14, while the high-current robustness can be adjusted by suitably designing the boost structure 30, in particular, by suitably selecting a doping concentration of the at least one auxiliary emitter region 31 or of the base region 33. In particular, the doping concentration of the second emitter region 14 may be chosen lower than in a comparable conventional transistor device without boost structure 30. According to one example, the doping concentration of the second emitter region 14 is selected from a range of between 1E17 cm$^{-3}$ and 1E18 cm$^{-3}$. The doping concentration of the at least one auxiliary emitter region 31 is selected from the same range according to one example. According to another example, the doping concentration of the auxiliary emitter region 31 is selected from a range of between 5E16 cm$^{-3}$ and 5E19 cm$^{-3}$, in particular between 1E17 cm$^{-3}$ and 1E19 cm$^{-3}$. According to one example, the doping concentration of the auxiliary emitter region 31 is higher than the doping concentration of the second emitter region 14. The curves labeled with 201, 202 and 203 schematically illustrate the doping concentrations of the device regions shown in the section on the left side in FIG. 11.

In the off-state of the transistor device, a space charge region (depletion region) expands in the drift region 11, the field stop region 15 and the body region 13. A magnitude of an electric field associated with this depletion region is schematically illustrated in FIG. 1. Referring to FIG. 1, a maximum of the electric field occurs at a pn junction between the drift region 11 and the body region 13, whereas the electric field decreases towards the source region 12 on the one side, and towards the field stop region 15 on the other side. An avalanche breakdown in the transistor device occurs if the magnitude of the electric field at the pn junction reaches a critical electric field strength (often referred to as $E_{CRIT}$). The curve shown on the right side in FIG. 1 illustrates the magnitude of the electric field strength when a load path voltage $V_{CE}$ is applied that causes the electrical field at the pn junction to reach this critical value $E_{CRIT}$. From FIG. 1 it can be seen that the transistor device is designed such that the electric field extends into the field stop region 15 where it decreases more rapidly than in the drift region 11 because a doping concentration of the field stop region 15 is higher than a doping concentration of the drift region 11. A doping concentration and a height E (see FIG. 5) of the field stop region 15 are selected such that the electric field in the off-state cannot reach the auxiliary emitter region 31. Thus, the boost structure 30 and, in particular, the at least one auxiliary emitter region 31 does not affect operation of the transistor device in the off-state. That is, the drift region 11 and the field-stop region 15 are designed such that the electric field stops (the absolute value of the electric-field strength becomes very small, close to zero) in the field-stop region 15 at a position spaced apart from the auxiliary emitter region 31 when a load path voltage is applied such that the electric field at the pn junction reaches the critical value $E_{CRIT}$, which is equivalent to that an avalanche breakdown occurs. Designing the drift region 11 and the field-stop region 15 in this way is equivalent to the fact that a dopant dose of the drift region 11 and the field stop region 15 in the current flow direction, which is the vertical direction z in the example shown in FIG. 1, is higher than a breakthrough charge. The breakthrough charge is given by an integral of a doping concentration of those sections of the drift region 11 and the field-stop region 15 across which the electrical field extends when the electrical field reaches the critical value $E_{CRIT}$, that is, the breakthrough charge is the integrated doping charge in those regions across which the electric field extends when the breakdown occurs. This breakthrough charge is substantially constant and dependent on a type of semiconductor material. The breakthrough charge is about $2E12$ $cm^{-2}$ if the semiconductor material of the drift region 11 and the field-stop region 15 is silicon (Si) and about $1E13$ $cm^{-3}$ if the semiconductor material of the drift region 11 and the field-stop region 15 is silicon (Si). According to one example, a doping concentration of the drift region 11 is selected from a range of between $5E12$ $cm^{-3}$ and $1E14$ $cm^{-3}$. According to one example, a minimum doping concentration of the field-stop region is selected from the range of between $1E14$ $cm^{-3}$ and $5E15$ $cm^{-3}$. According to one example, shown in FIG. 11, a doping concentration of the field-stop region 15 has a maximum close to the drift region 11 and decreases towards the at least one auxiliary emitter region 31. According to one example, the field-stop region has the minimum doping concentration close to the auxiliary emitter region 31, whereas this minimum doping concentration of the field stop region 15 is higher than the doping concentration of the base region 11. The maximum doping concentration is selected from a range of between $1E15$ $cm^{-3}$ and $1E16$ $cm^{-3}$, according to one example. The dopant dose explained before, of the drift region 11 and the field-stop region 15 can be obtained by integrating the doping concentration of the drift region 11 and the field-stop region 15 in the current flow direction, which is the vertical direction z in the example shown in FIG. 1. A length of the drift region 11 in the current flow direction can be designed is dependent on a desired voltage blocking capability of the transistor device. The length is between 80 micrometers and 120 micrometers, for example, in a transistor device with a voltage blocking capability of 1.2 kilovolts (kV) and between 500 micrometers and 700 micrometers in a transistor device with a voltage blocking capability of 6.5 kilovolts.

Figure 13:
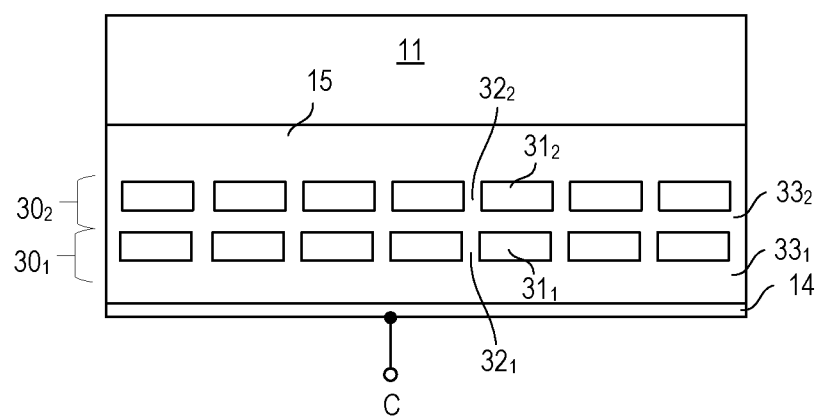
FIG. 13 illustrates one section of a transistor device that includes two boost structures.

FIG. 13 shows one section of the transistor device according to another example. In this example, the transistor device includes two boost structures, a first boost structure $30_1$ and a second boost structure $30_2$ between the field-stop region 15 and the second emitter region 14 (the cell region of the transistor device is not shown in FIG. 13). Each of these boost structures $30_1$, $30_2$ includes an auxiliary emitter region $31_1$, $31_2$, a pass region $32_1$, $32_2$ and a base region $33_1$, $33_2$. The base region $33_1$ of the first boost structure $30_1$ is arranged between the auxiliary emitter region $31_1$ of the first boost structure $30_1$ and the second emitter 14. The base region $33_2$ of the second boost structure $30_2$ is located between the auxiliary emitter region $31_2$ of the second boost structure $30_2$ and the auxiliary emitter region $31_1$ of the first boost structure $30_1$. Of course, the transistor device is not restricted to have one or two boost structures. Based on the topology shown in FIG. 13 additional boost structures may be added between the second boost structure and the field-stop region 15.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof

What is claimed is:

1. A transistor device, comprising:
  a first emitter region of a first doping type, a second emitter region of a second doping type, a body region of the second doping type, a drift region of the first doping type, a field-stop region of the first doping type, and at least one boost structure; and
  a gate electrode dielectrically insulated from the body region by a gate dielectric,
  wherein the body region is arranged between the first emitter region and the drift region, the field-stop region is arranged between the drift region and the boost structure, and the boost structure is arranged between the field-stop region and the second emitter region,
  wherein the at least one boost structure comprises a base region of the first doping type and at least one auxiliary emitter region of the second doping type separated from the second emitter region by the base region,
  wherein an overall dopant dose in the drift region and the field-stop region in a current flow direction of the transistor device is higher than a breakthrough charge of a semiconductor material of the drift region and the field-stop region.

2. The transistor device of claim 1, wherein the semiconductor material is selected from the group consisting of: silicon; and silicon carbide.

3. The transistor device of claim 1, wherein the at least one boost structure comprises two or more boost structures.

4. The transistor device of claim 1, wherein the at least one auxiliary emitter region comprises a plurality of auxiliary emitter regions that are spaced apart in a direction perpendicular to the current flow direction, and wherein the at least one boost structure further comprises a pass region of the first doping type laterally interposed between neighboring ones of the plurality of auxiliary emitter regions and connecting the field-stop region with the base region to allow charge carriers to pass the plurality of auxiliary emitter regions between the field-stop region and the base region.

5. The transistor device of claim 4, wherein a distance between two neighboring auxiliary emitter regions of the plurality of auxiliary emitter regions is in a range between 500 nanometers and 10 micrometers, or between 1 micrometer and 6 micrometers.

6. The transistor device of claim 1, wherein the at least one auxiliary emitter region comprises a grid shaped auxiliary emitter region.

7. The transistor device of claim 1, wherein the semiconductor material is silicon and a doping concentration of the at least one auxiliary emitter region is in a range between $1E18$ $cm^{-3}$ and $1E19$ $cm^{-3}$.

8. The transistor device of claim 1, wherein a length of the at least one auxiliary emitter region in the current flow direction is in a range between 1 micrometer and 10 micrometers, or between 1 micrometer and 6 micrometers.

9. The transistor device of claim 1, wherein a doping concentration of the second emitter region is lower than a doping concentration of the at least one auxiliary emitter region.

10. The transistor device of claim 1, wherein a doping concentration of the second emitter region is in a range between $1E16$ cm$^{-3}$ and $1E18$ cm$^{-3}$, or between $5E16$ cm$^{-3}$ and $5E17$ cm$^{-3}$.

11. The transistor device of claim 1, wherein the drift region has a lower doping concentration than the field-stop region.

12. The transistor device of claim 11, wherein a doping concentration of the drift region is in a range between $5E12$ cm$^{-3}$ and $1E14$ cm$^{-3}$, and wherein a minimum doping concentration of the field-stop region is in a range between $1E14$ cm$^{-3}$ and $5E15$ cm$^{-3}$.

13. The transistor device of claim 12, wherein a doping concentration of the field-stop region decreases towards the boost structure, and wherein a maximum doping concentration of the field-stop region is in a range between $1E15$ cm$^{-3}$ and $5E16$ cm$^{-3}$.

14. The transistor device of claim 12, wherein a doping concentration of the field-stop region increases towards the boost structure, and wherein a maximum doping concentration of the field-stop region is in a range between $1E15$ cm$^{-3}$ and $5E16$ cm$^{-3}$.

15. The transistor device of claim 1, wherein a length of the base region between the at least one auxiliary emitter region and the second emitter region is in a range between 0.5 micrometers and 10 micrometers.

16. The transistor device of claim 15, wherein the length of the base region is less than 5 micrometers.

17. The transistor device of claim 1, wherein a doping concentration of the base region is in a range between $1E14$ cm$^{-3}$ and $5E15$ cm$^{-3}$.

18. The transistor device of claim 1, wherein a doping concentration of the field-stop region has a maximum close to the drift region and decreases towards the at least one auxiliary emitter region to a level above a doping concentration of the drift region, and wherein a doping concentration of the base region of the at least one boost structure exceeds the doping concentration of the drift region.

19. A transistor device that can be operated in an on-state and an off-state, comprising:
   a first emitter region of a first doping type, a second emitter region of a second doping type, a body region of the second doping type, a drift region of the first doping type, a field-stop region of the first doping type, and at least one boost structure; and
   a gate electrode dielectrically insulated from the body region by a gate dielectric,
   wherein the body region is arranged between the first emitter region and the drift region, the field-stop region is arranged between the drift region and the boost structure, and the boost structure is arranged between the field-stop region and the second emitter region,
   wherein the at least one boost structure comprises a base region of the first doping type and at least one auxiliary emitter region of the second doping type separated from the second emitter region by the base region,
   wherein a doping profile of the drift region and the field-stop region is such that in the off-state of the transistor device an electric field associated with applying a load path voltage between the first emitter region and the second emitter region stops in the field-stop region spaced apart from the at least one auxiliary emitter region when a critical field strength is reached at a pn junction between the body region and the drift region.

* * * * *